United States Patent
Odnoblyudov et al.

(10) Patent No.: US 10,141,371 B2
(45) Date of Patent: Nov. 27, 2018

(54) WIDE BAND GAP DEVICE INTEGRATED CIRCUIT DEVICE

(71) Applicant: QROMIS, Inc., Santa Clara, CA (US)

(72) Inventors: Vladimir Odnoblyudov, Danville, CA (US); Cem Basceri, Los Gatos, CA (US)

(73) Assignee: Qromis, Inc., Santa Clara, CA (US)

( * ) Notice: Subject to any disclaimer, the term of this patent is extended or adjusted under 35 U.S.C. 154(b) by 0 days.

(21) Appl. No.: 15/367,108

(22) Filed: Dec. 1, 2016

(65) Prior Publication Data

US 2017/0170232 A1 Jun. 15, 2017

Related U.S. Application Data

(60) Provisional application No. 62/263,462, filed on Dec. 4, 2015.

(51) Int. Cl.
*H01L 27/15* (2006.01)
*H01L 21/02* (2006.01)
(Continued)

(52) U.S. Cl.
CPC .......... *H01L 27/15* (2013.01); *H01L 21/0254* (2013.01); *H01L 21/02389* (2013.01);
(Continued)

(58) Field of Classification Search
None
See application file for complete search history.

(56) References Cited

U.S. PATENT DOCUMENTS 6,841,806 B1 * 1/2005 Taylor ............... H01L 27/0817
257/183
8,274,086 B2 * 9/2012 Malhan ............... H01L 29/063
257/76
(Continued)

FOREIGN PATENT DOCUMENTS

TW 201730921 A 9/2017
WO 2017096032 A1 6/2017

OTHER PUBLICATIONS

PCT/US2016/064405, "International Search Report and Written Opinion", dated Mar. 31, 2017, four pages.
PCT/US2016/064405, "Invitation to Pay Add'l Fees and Partial Search Rpt", dated Jan. 17, 2017, two pages.

*Primary Examiner* — Bilkis Jahan
(74) *Attorney, Agent, or Firm* — Kilpatrick Townsend & Stockton LLP

(57) ABSTRACT

Disclosed herein are wide band gap integrated circuits, such as gallium nitride (GaN) integrated circuits, including a plurality of groups of epitaxial layers formed on an engineered substrate, and methods of making the WBG integrated circuits. The epitaxial layers have a coefficient of thermal expansion (CTE) substantially matching the CTE of the engineered substrate. Mesas, internal interconnects, and electrodes configure each group of epitaxial layers into a WBG device. External interconnects connect different WBG devices into a WBG integrated circuit. The CTE matching allows the formation of epitaxial layers with reduced dislocation density and an overall thickness of greater than 10 microns on a six-inch or larger engineered substrate. The large substrate size and thick WBG epitaxial layers allow a large number of high density WBG integrated circuits to be fabricated on a single substrate.

12 Claims, 7 Drawing Sheets

(51) Int. Cl.

| | |
|---|---|
| *H01L 21/285* | (2006.01) |
| *H01L 21/306* | (2006.01) |
| *H01L 29/20* | (2006.01) |
| *H01L 29/778* | (2006.01) |
| *H01L 33/00* | (2010.01) |
| *H01L 33/06* | (2010.01) |
| *H01L 33/32* | (2010.01) |
| *H01L 29/417* | (2006.01) |

(52) U.S. Cl.
CPC .. *H01L 21/28575* (2013.01); *H01L 21/30612* (2013.01); *H01L 29/2003* (2013.01); *H01L 29/7786* (2013.01); *H01L 29/7787* (2013.01); *H01L 33/0075* (2013.01); *H01L 33/06* (2013.01); *H01L 33/32* (2013.01); *H01L 29/41766* (2013.01)

(56) References Cited

U.S. PATENT DOCUMENTS

| | | | |
|---|---|---|---|
| 2004/0036074 A1* | 2/2004 | Kondo | H01L 21/6835 |
| | | | 257/79 |
| 2004/0079408 A1* | 4/2004 | Fetzer | H01L 31/184 |
| | | | 136/262 |
| 2009/0072267 A1 | 3/2009 | Goshonoo et al. | |
| 2011/0147772 A1* | 6/2011 | Lochtefeld | C30B 29/06 |
| | | | 257/94 |
| 2011/0260210 A1* | 10/2011 | Su | C23C 16/24 |
| | | | 257/103 |
| 2013/0032836 A1 | 2/2013 | Chen et al. | |
| 2014/0094223 A1* | 4/2014 | Dasgupta | H01L 29/4236 |
| | | | 455/566 |
| 2014/0183442 A1 | 7/2014 | Odnoblyudov et al. | |
| 2014/0346546 A1 | 11/2014 | D'Evelyn et al. | |

* cited by examiner

WIDE BAND GAP DEVICE INTEGRATED CIRCUIT DEVICE

CROSS-REFERENCES TO RELATED APPLICATIONS

This application claims the benefit of U.S. Provisional Patent Application No. 62/263,462, filed on Dec. 4, 2015, the contents of which is incorporated herein by reference in its entirety for all purposes.

BACKGROUND OF THE INVENTION

Wide band gap (WBG) semiconductor devices are expensive and time consuming to manufacture. For example, gallium nitride (GaN) materials may be formed by a heteroepitaxial (epi) growth process that involves depositing GaN on a semiconductor carrier substrate having a different lattice structure (or lattice constant) than the deposited GaN. The lattice mismatch between the GaN and the carrier substrate may create defects, dislocations, and strains that may negatively impact device yields and performance. In addition, the GaN layers and carrier substrate may have different coefficients of thermal expansion (CTEs). Thermal processing (e.g., GaN epitaxial growth) can crack or delaminate the GaN, or bow and, in some cases, break the carrier substrate. The different CTEs may restrict substrate wafer size, limiting scale and preventing reduction of the overall manufacturing cost of WBG devices and solutions.

SUMMARY OF THE INVENTION

The present invention relates generally to fabricating WBG integrated circuits using an engineered substrate. More specifically, the present invention relates to methods and systems suitable for fabricating high density, low cost WBG integrated circuits (e.g., GaN integrated circuits) using a large engineered substrate and a thick WBG epitaxial layer that includes a plurality of groups of epitaxial layers, where the CTE of the engineered substrate substantially matches the CTE of the WBG epitaxial layer. As described herein, some embodiments of the present invention have been applied to fabricating solid state devices on an engineered substrate by epitaxial growth. The methods and techniques can be applied to a variety of semiconductor processing operations. For example, some embodiments of the present invention include methods of fabricating solid state devices on an engineered substrate by growing a plurality of groups of epitaxial layers on the engineered substrate and then etching the epitaxial layers to expose at least an area of each group of epitaxial layers for forming electrical connections and isolations. Some embodiments of the present invention include methods of fabricating solid state devices on an engineered substrate by forming a first group of epitaxial layers on the engineered substrate, masking at least an area of the formed group of epitaxial layers, forming a second group of epitaxial layers on top of areas of the first group of epitaxial layers that are not masked, and forming electrical connections and isolations within the masked area.

According to an embodiment of the present invention, a method of fabricating integrated circuits includes forming a WBG epitaxial layer on an engineered substrate, where the WBG epitaxial layer includes a plurality of groups of epitaxial layers and the engineered substrate includes engineered layers formed on a bulk material. The bulk material having a CTE matching a CTE of the WBG epitaxial layer. The method also includes forming internal interconnects and electrodes within each group of the plurality of groups of epitaxial layers to configure each group of epitaxial layers into a WBG device of a plurality of WBG devices. The method further includes forming external interconnects between the electrodes of different WBG devices of the plurality of WBG devices to form an integrated circuit. In some embodiments, the WBG epitaxial layer formed on the engineered substrate have a thickness of at least 10 microns. In some embodiments, the bulk material has a diameter of at least 150 millimeters.

According to another embodiment of the present invention, a device includes a plurality of groups of GaN epitaxial layers, where the combined thickness of the plurality of groups of GaN epitaxial layers is greater than ten microns. The device also includes mesas etched within at least some groups of the plurality of groups of GaN epitaxial layers, internal interconnects formed within the mesas, and electrodes formed on at least one of the internal interconnects or the GaN epitaxial layers, where the electrodes configures each group of GaN epitaxial layers into a GaN device of a plurality of GaN devices. The device further includes external interconnects formed over at least some of the electrodes for connecting the plurality of GaN devices into an integrated circuit. In some embodiments, the plurality of groups of GaN epitaxial layers is formed on an engineered substrate with a diameter of at least 150 millimeters. In some embodiments, a CTE of the plurality of groups of GaN epitaxial layers matches a CTE of the engineered substrate.

According to a further embodiment of the present invention, a GaN integrated circuit includes a first set of GaN layers, and a first set of mesas, interconnects, and electrodes for configuring the first set of GaN layers into a first GaN device. The GaN integrated circuit also includes a second set of GaN layers formed on top of the first set of GaN layers, and a second set of mesas, interconnects, and electrodes for configuring the second set of GaN layers into a second GaN device. The GaN integrated circuit further includes a third set of interconnects formed on at least some electrodes from the first set of mesas, interconnects, and electrodes and at least some electrodes from the second set of mesas, interconnects, and electrodes for connecting the first GaN device to the second GaN device. In some embodiments, the first and second sets of GaN layers have a combined thickness of at least 10 microns. In some embodiments, the first and second sets of GaN layers are formed on an engineered substrate with a diameter of at least six inches and have a CTE substantially matching a CTE of the engineered substrate.

Numerous benefits can be achieved by way of the present invention over conventional techniques. For example, embodiments of the present invention provide solid state devices, such as light-emitting diodes (LEDs) or high electron mobility transistors (HEMTs), formed on engineered substrates that have a CTE that is substantially matched to the CTE of the epitaxial layers of the solid state devices. Matching the thermal expansion properties of the growth substrate to the epitaxial layer reduces the stress in the epitaxial layers and/or the engineered substrate. Stress is responsible for several types of defects. For example, stress may increase dislocation density in the epitaxial layer, which may impair electrical and optical properties of the epitaxial layer. Stress may also lead to residual strain in the epitaxial layer or the substrate, which may lead to additional processing concern in later steps, such as stress cracking, dislocation glide, slip, bow, and warp. Thermal expansion induced bow and warp of the substrate may make handling of the material problematic in automated equipment, and may limit the ability to perform additional lithographic steps necessary for device fabrication. In addition, the device performance lifetime may be reduced in stressed materials. Stress relaxation and stress-induced crack propagation, dislocation glide, and other lattice movement resulting from thermal mismatch may lead to early failures in a range of modes, from reduced device performance to fracture or peeling of devices and device layers.

Embodiments of the present invention provide methods and techniques for fabricating high density, low cost WBG integrated circuits using a large engineered substrate having a CTE that matches the CTE of the WBG epitaxial layer. Because the CTE match, a thicker epitaxial layer may be formed. The thicker epitaxial layer may reduce the overall dislocation density of the lattice structures of the epitaxial layer, and thus may improve the performance and reliability of integrated circuits manufactured using the thick epitaxial layer. Furthermore, the thicker epitaxial layer may allow more devices to be integrated in each unit area, and therefore may increase the device density, reduce the size of each integrated circuit, and/or allow more complex circuitry to be manufactured. Because the size of each integrated circuit may be reduced and a large substrate can be used, more integrated circuits may be made on one substrate. In addition, the engineered substrate may be separated from the manufactured integrated circuits and be reused to grow new epitaxial layers. Therefore, the overall cost of each integrated circuit may be reduced significantly.

These and other embodiments of the invention along with many of its advantages and features are described in more detail in conjunction with the text below and attached figures.

DETAILED DESCRIPTION OF THE INVENTION

The present invention relates generally to fabricating wide band gap (WBG) integrated circuits using an engineered substrate. More specifically, the present invention relates to methods and systems for fabricating high performance, high density, low cost WBG integrated circuits, such as gallium nitride (GaN) integrated circuits, using a large engineered substrate and a thick WBG epitaxial layer that includes a plurality of groups of epitaxial layers, where the coefficient of thermal expansion (CTE) of the engineered substrate substantially matches the CTE of the WBG epitaxial layer. As described herein, some embodiments of the present invention have been applied to fabricating solid state devices on an engineered substrate by epitaxial growth. The methods and techniques can be applied to a variety of semiconductor processing operations. It is note that although GaN integrated circuits are used as examples in some embodiments described below, other WBG integrated circuits may be made using the methods and techniques disclosed here.

GaN Epitaxial Layers on Engineered Substrate

Figure 1:
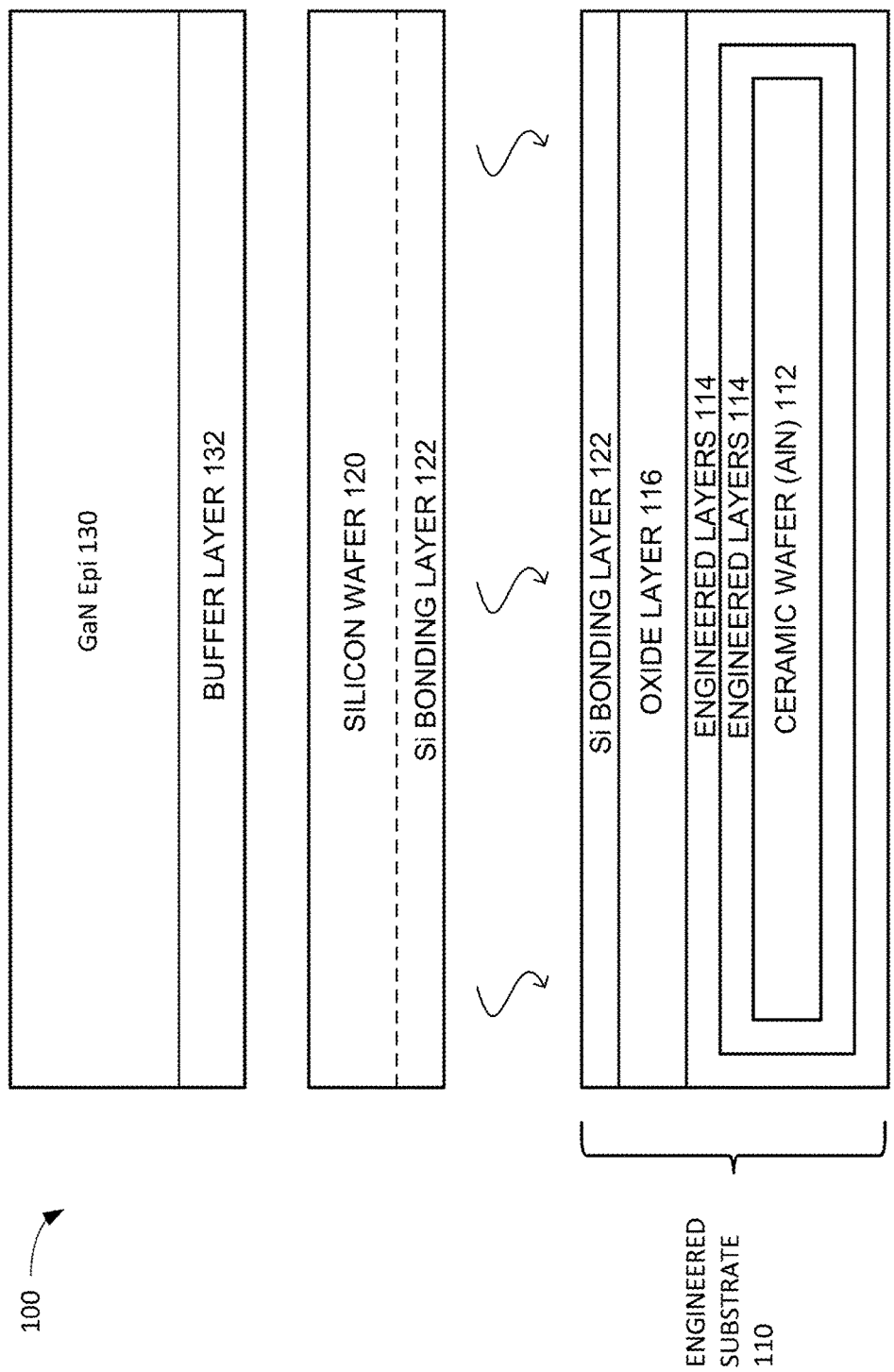
FIG. 1 shows a GaN epitaxial layer formed on an engineered substrate.

FIG. 1 shows a GaN epitaxial layer 130 formed on an engineered substrate (ES) 110. Manufacturing of engineered substrate 110 may begin with a polycrystalline ceramic wafer 112, such as an aluminum nitride (AlN) wafer. In various embodiments, ceramic wafer 112 may comprise other polycrystalline materials, such as silicon carbide (SiC), gallium nitride (GaN), aluminum gallium nitride (AlGaN), etc.

A series of engineered layers 114, such as layers of oxide, nitride, and polysilicon, can be deposited onto ceramic wafer 112 to form outer layers of engineered substrate 110. Engineered layers 114 may provide adhesion, defect management, and a diffusion barrier for subsequent GaN epitaxial layers. An additional oxide layer 116 may be deposited on one side of ceramic wafer 112. A portion of oxide layer 116 may be polished using a chemical mechanical planarization (CMP) process to create a smooth surface for subsequent wafer bonding.

A layer transfer process may be performed using a silicon wafer 120. Silicon wafer 120 may be implanted with several elements to create a damage interface inside Si, which may help to form a silicon bonding layer 122 for attaching to oxide layer 116. For example, applying pressure on silicon wafer 120 and oxide layer 116 that are attached together may atomically bond silicon wafer 120 to oxide layer 116.

After the bonding process, an exfoliation process may activate the damage interface inside silicon wafer 120 and cause the implanted elements in silicon bonding layer 122 to expand, thus splitting the top portion of silicon wafer 120 from ceramic wafer 112 with engineered layers 114. Remaining silicon bonding layer 122 bonded to oxide layer 116 may be relatively thin, such as less than around 5 microns, and therefore may not significantly contribute to the CTE of engineered substrate 110. The CTE of engineered substrate 110 is therefore primarily determined by the CTE of ceramic wafer 112.

Materials other than silicon may be used to create a single crystal thin bonding layer. These single crystal materials may include SiC, GaN, AlGaN, AlN, ZnO, sapphire, and other.

GaN epitaxial layer 130 (which may also be referred to as epitaxial layers) can be formed by epitaxially growing a number of layers or sub-layers to form an epitaxial structure on top of engineered substrate 110. As used herein, the term "layer" should be understood to include a structure including multiple layers or sub-layers of the same or different materials. In some embodiments, a buffer layer 132 may be formed on silicon bonding layer 122, and GaN epitaxial layer 130 (epitaxial layers) may be formed on top of buffer layer 132. The CTEs of ceramic wafer 112 and GaN epitaxial layer 130 may be substantially matched over a wide temperature range (e.g., from about 25° C. to about 1200° C.), such as within about 0.1%, 0.5%, 1%, 2%, 5%, or 10% of each other. This CTE matching enables the formation of higher quality epitaxial layers on larger ceramic wafers 112 without cracking or warping. For example, GaN epitaxial layer 130 may be formed on 6-inch, 8-inch, 12-inch, or larger engineered substrates 110. Using larger wafers may increase the device count per wafer and thus result in less expensive GaN devices.

The CTE matching may also enable the formation of a significantly thicker GaN epitaxial layer 130 (e.g., tens or hundreds of microns) on top of engineered substrate 110. The combined epitaxial layers may reduce the overall dislocation density of the lattice structures between GaN epitaxial layer 130 and silicon bonding layer 122. In addition, a larger number of epitaxial layers can be used to fabricate more complex circuity for a wider array of GaN devices.

Other example engineered substrates and other epitaxial structures are described in the following U.S. patents which are all incorporated herein by reference in their entireties: U.S. Pat. No. 7,358,152; U.S. Pat. No. 7,535,100; U.S. Pat. No. 6,593,212; U.S. Pat. No. 6,497,763; U.S. Pat. No. 6,328,796; U.S. Pat. No. 6,323,108; U.S. Pat. No. 9,293,678; U.S. Pat. No. 9,082,692; U.S. Pat. No. 9,269,858; U.S. Pat. No. 9,147,803; U.S. Pat. No. 9,012,253; U.S. Pat. No. 8,436,362; U.S. Pat. No. 8,729,563; and U.S. Pat. No. 9,166,107.

GaN Integrated Circuits on Engineered Substrate

Figure 2:
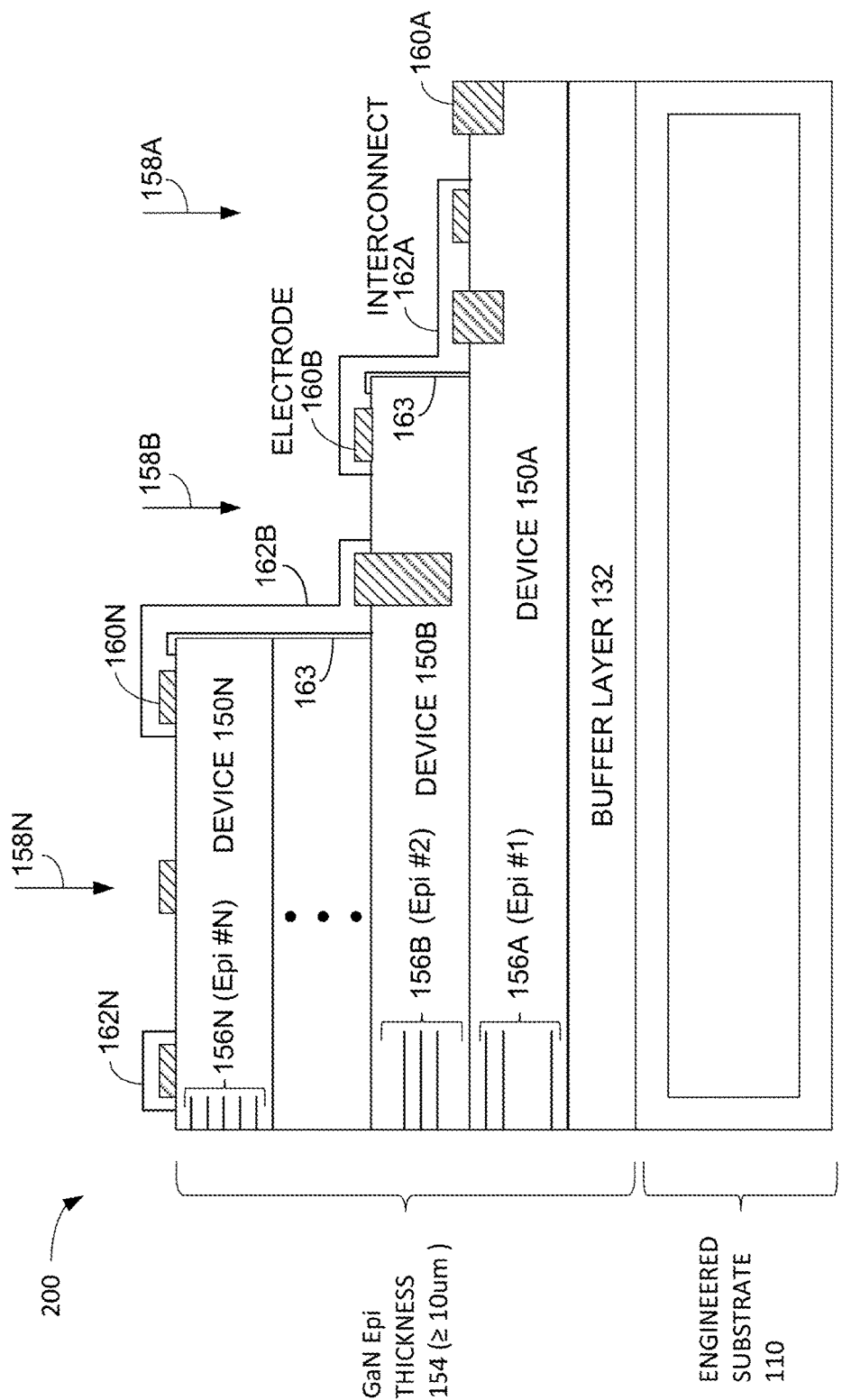
FIG. 2 is a side sectional view of an integrated circuit including multiple GaN devices formed on an engineered substrate.

FIG. 2 is side sectional view of an integrated circuit 200 including multiple GaN devices 150 formed on engineered substrate 110. As described above, the CTE matching between engineered substrate 110 and GaN epitaxial layer 130 enables thicker GaN device formation on larger wafers. For example, the CTE matching enables the formation of GaN devices 150 on engineered substrate 110 with a diameter 152 equal to or greater than about 150 millimeters (i.e., approximately 6 inches or larger). The CTE matching also enables a combined GaN epitaxial layer with a thickness 154 of equal to or greater than around 10 microns to be formed on engineered substrate 110.

Larger wafer diameter 152 may enable the formation of more dies on a same substrate. Greater GaN epitaxial layer thickness 154 may enable the vertical formation of more GaN devices 150 with more complex integrated circuitry on each die. Wafer diameter 152 and GaN epitaxial layer thickness 154 may be larger or smaller in various embodiments.

GaN devices 150A-150N may each be formed using one or more groups of GaN epitaxial layers 156. For example, a group of epitaxial layers 156A for GaN device 150A may be formed on top of buffer layer 132. A group of epitaxial layers 156B for GaN device 150B may be formed on top of epitaxial layers 156A for GaN device 150A. Various numbers of additional epitaxial layers for various numbers of additional GaN devices may be formed on top of epitaxial layers 156A and 156B.

After the formation of epitaxial layers 156, a first etching process 158A may be performed to etch epitaxial layers 156 down to epitaxial layers 156A for GaN device 150A. For example, in some embodiments, a mask may be located on the left and center portions of epitaxial layers 156. First etching process 158A, such as a chemical, vapor, or laser etching process, can then be used to etch through epitaxial layers 156N-156B down to epitaxial layers 156A.

A set of mesas, interconnects, and electrodes 160A may then be formed on one or more layers of the group of epitaxial layers 156A. For example, mesas and interconnects may extend down to one or more layers of epitaxial layers 156A. Electrodes 160A may then be formed on the interconnects to configure epitaxial layers 156A into GaN device 150A.

A second etching process 158B may be performed to etch epitaxial layers 156 down to the group of epitaxial layers 156B for GaN device 150B. For example, a mask may be located on the left and right lateral portions of epitaxial layers 156. A wet etch or dry etch process may then be used to etch epitaxial layers 156 down to epitaxial layers 156B. A second set of mesas, interconnects, and electrodes 160B may be formed on one or more layers of epitaxial layers 156E to configure epitaxial layers 156B into GaN device 150B, as described above with respect to GaN device 150A. Etching processes 158 (such as etching process 158N) and mesa, interconnect, and electrode formation processes may be repeated for each group of epitaxial layers 156 to form a GaN device 150 using each group of epitaxial layers 156.

Interconnects 162 may be formed between or after etching processes 158 and the formation of GaN devices 150. For example, a mask may be placed over areas where no interconnects 162 are desired. Interconnects 162 may then be formed over the exposed area to connect electrodes 160 of different GaN devices 150. For example, an interconnect 162A may connect some of electrodes 160A for GaN device 150A with some of electrodes 160E for GaN device 150B.

In the same or a different process, an interconnect 162B may be formed on portions of GaN devices 150B and 150N to connect some of electrodes 160B for GaN device 150B with some of electrodes 160N for GaN device 150N. In the same or a different process, an interconnect 162N that connects some of electrodes 160N on GaN device 150N to electrodes on other GaN devices 150 may be formed.

In some embodiments, a process may be performed before the formation of interconnect(s) 162 to form insulation layer(s) 163 underneath interconnect(s) 162 to electrically isolate the different GaN devices 150.

Each group of epitaxial layers 156A-156N may form different types of unipolar or bipolar GaN device with different combinations of n- or p-doped regions. Epitaxial layers 156 may form various combinations of electronic devices, optoelectronic devices, power devices, or radio frequency (RF) devices.

In some embodiments, a "selective epitaxial" process may be employed as an alternative to post-epitaxial etch processes 158A, 158B, . . . , and 158N described above, to form an alternative N-device epitaxial structure. For example, in one selective epitaxial process, after deposition of a first group of epitaxial layers (epi #1) for GaN device 150A, areas of the surface of the wafer may be masked with an organized pattern to prevent subsequent GaN deposition on the masked areas.

while the wafer is masked, a second group of epitaxial layers (epi #2) for GaN device 150B may be deposited on epi #1. Masked areas on the surface of epi #1 do not receive any deposition of epi #2. This selective epitaxial deposition process may be performed iteratively to create the mesa structure with N groups of epitaxial layers (including epi #1, epi #2, . . . , and epi #N) shown in FIG. 2. Electrodes 160, insulation layers 163, and interconnects 162 may be formed during or after the completion of the iterative selective epitaxial deposition process.

Example Integrated Circuit and Its Fabrication

Figure 3:
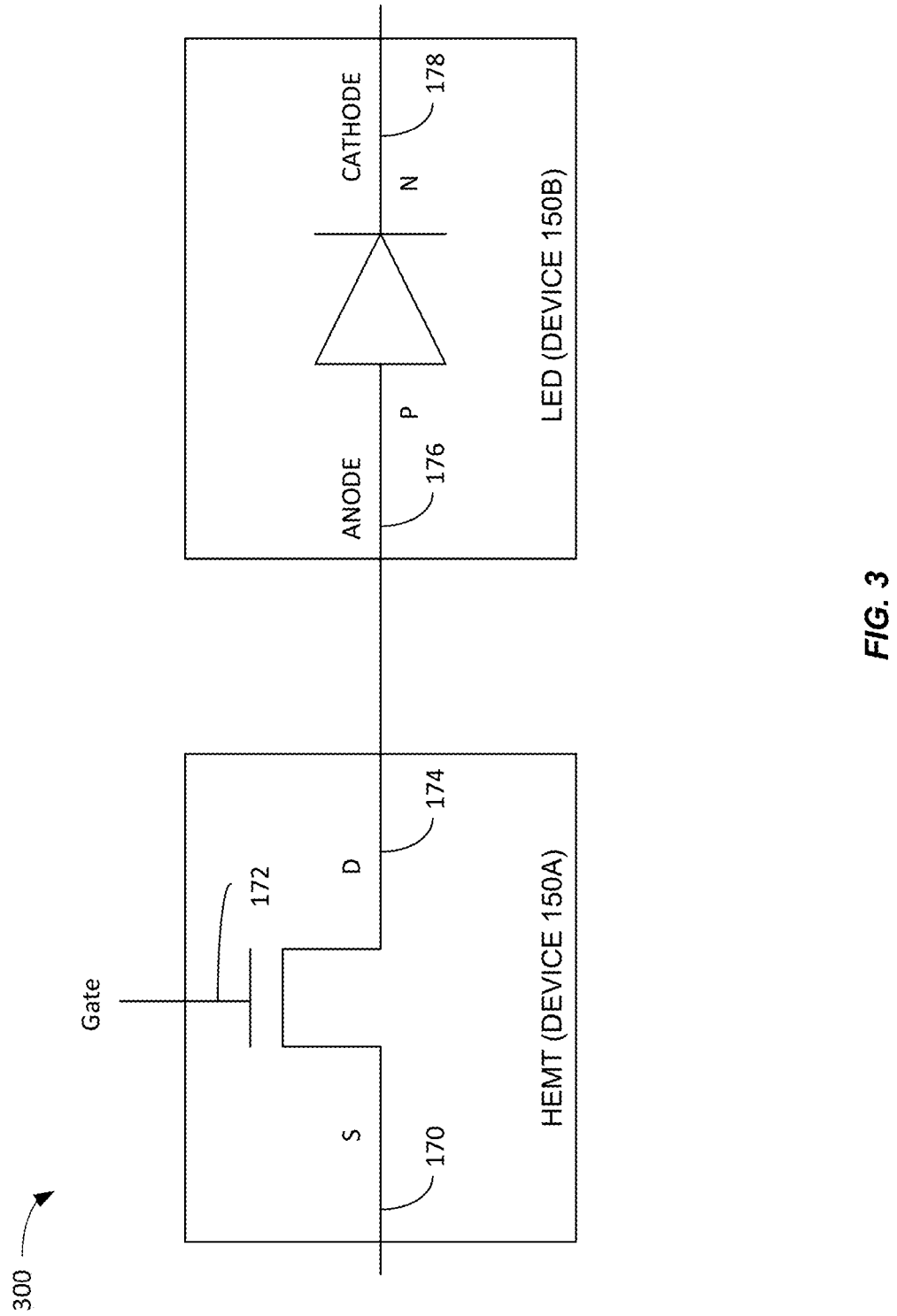
FIG. 3 shows an example integrated circuit formed on an engineered substrate.

FIG. 3 shows one example integrated circuit 300 formed on an engineered substrate using GaN epitaxial layers 156 shown in FIG. 2. In this example, the group of epitaxial layers for GaN device 150A may form a wide band gap (WBG) filed effect high electron mobility transistor (HEMT), and the group of epitaxial layers for GaN device 150B may form a light emitting diode (LED). The HEMT (GaN device 150A) includes a source 170, a gate 172, and a drain 174. The LED (GaN device 150B) includes an n-doped cathode 178 and a p-doped anode 176 connected to drain 174 of the HEMT (GaN device 150A).

Figure 4:
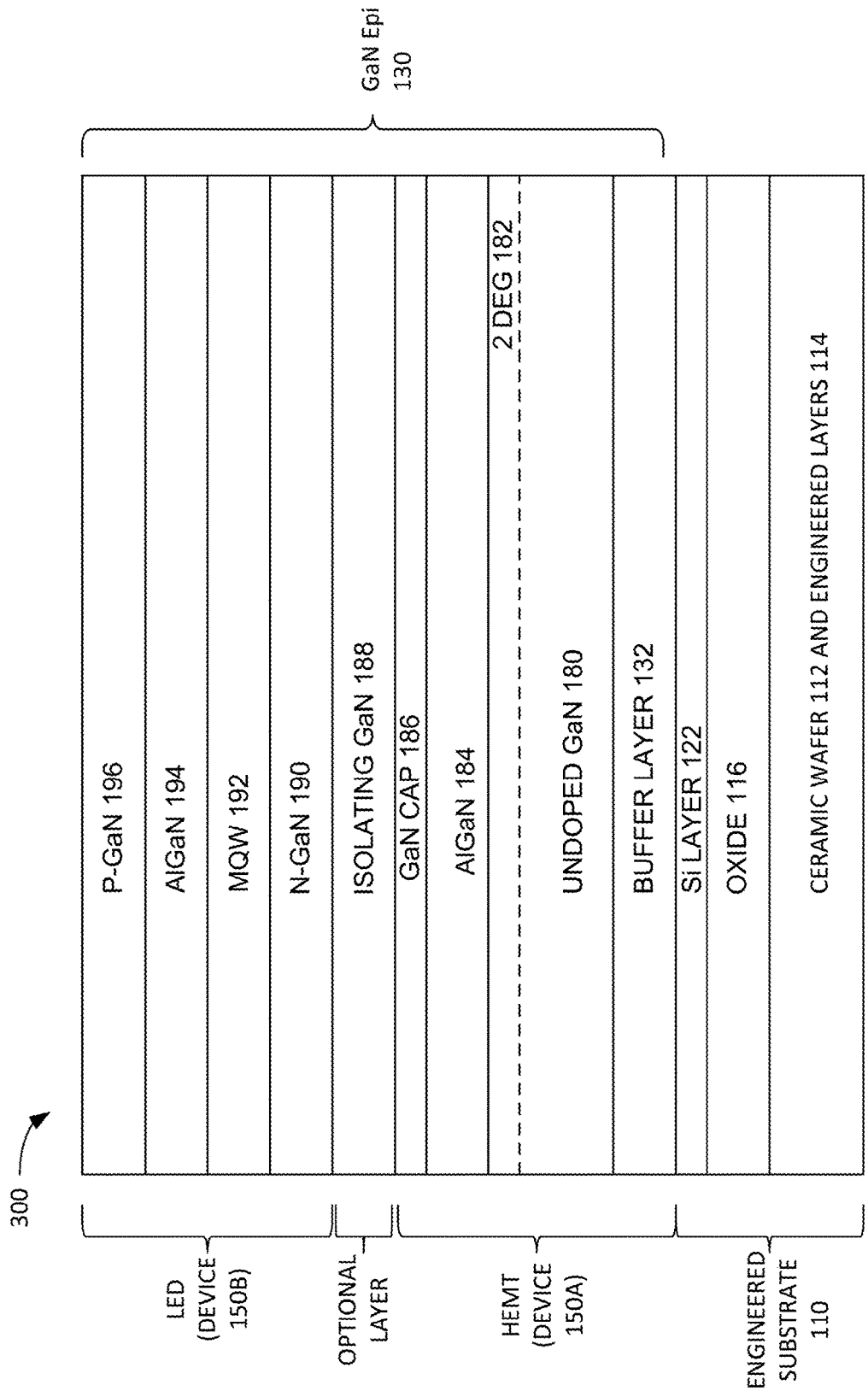
FIG. 4 shows different GaN layers used for different GaN devices.

FIG. 4 shows different GaN layers used for different GaN device in an example GaN epitaxial layer 130 for forming integrated circuit 300 of FIG. 3. Again, this is just one example, and other architectures may also form the HEMT (GaN device 150A) and the LED (GaN device 150B). A typical group of epitaxial layers for the HEMT may include an undoped GaN layer 180 formed on buffer layer 132, and an aluminum gallium nitride (AlGaN) layer 184 deposited on GaN layer 180. Two dimensional electron gas (2 DEG) may be formed under AlGaN layer 184 as a result of polarization-induced conduction band bending. A GaN cap layer 186 may be formed as a protective layer over AlGaN layer 184.

An optional isolating GaN layer 188 may be formed over GaN cap layer 186 to provide an electrical isolation between the HEMT (GaN device 150A) and the LED (GaN device 150B). Isolating GaN layer 188 also may provide protection against over-etching when exposing the group of epitaxial layers for the HEMT.

The group of GaN epitaxial layers for the LED (GaN Device 150B) may be formed on top of the group of epitaxial layers for the HEMT. For example, an n-type GaN (N-GaN) layer 190 may be formed on isolating GaN layer 188. An active region with multiple layers of GaN and indium gallium nitride (InGaN) may form an active multiple quantum well (MQW) layer 192. The next operations may form a current-blocking aluminum gallium nitride (AlGaN) layer 194 on top of MQW layer 192, and a p-type GaN (P-GaN) layer 196 on AlGaN layer 194.

Applying a voltage across N-GaN layer 190 and P-GaN layer 196 may inject carriers into MQW layer 192 and cause light emission. In one example, the groups of epitaxial layers forming the HEMT (GaN device 150A) and the LED (GaN device 150B) are each up to approximately 5- or 6-μm thick. In one example, the combination of P-GaN layer 196, AlGaN layer 194, and MQW layer 192 is approximately 0.5-μm thick.

Figure 5:
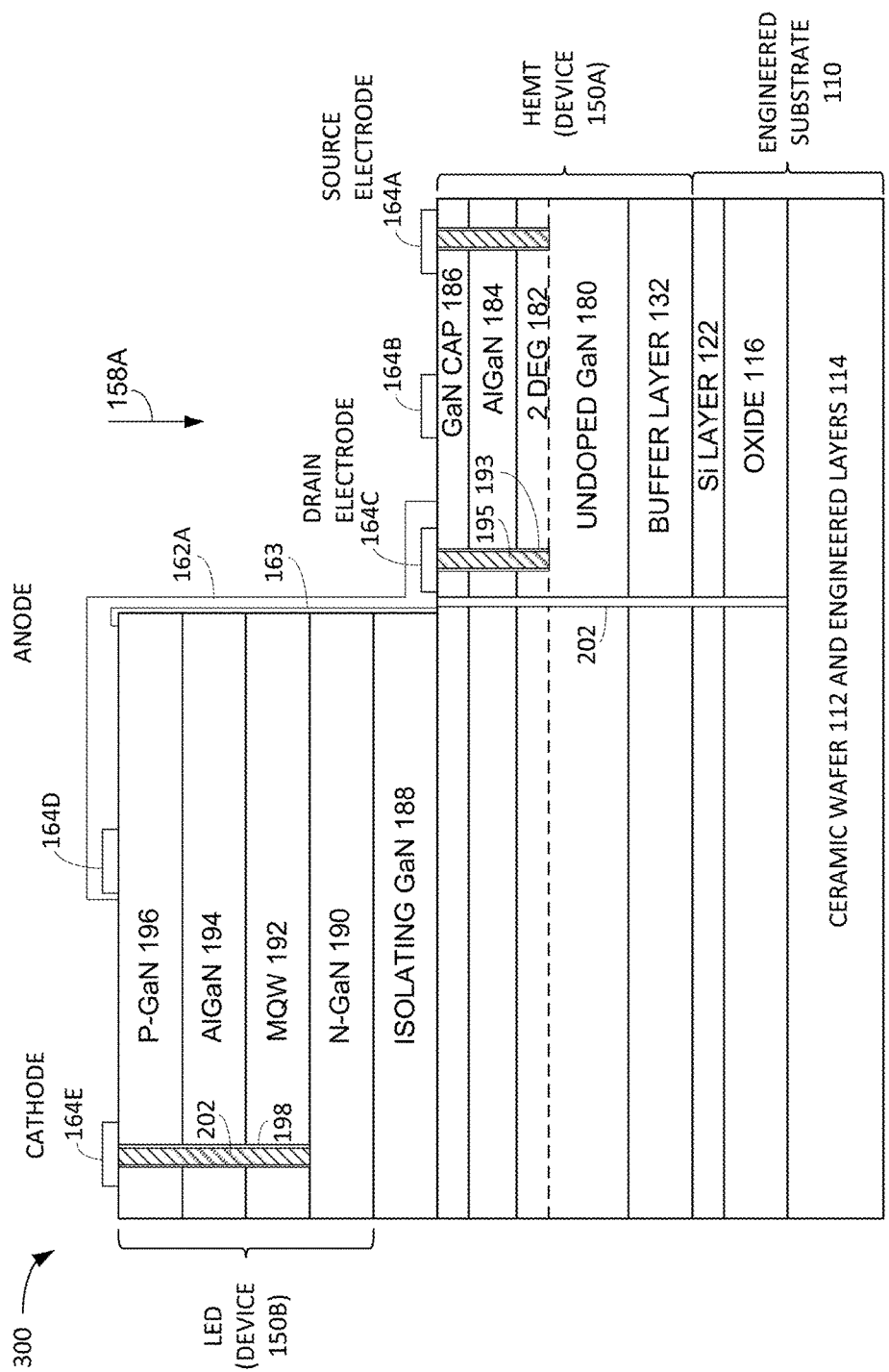
FIG. 5 shows how different GaN devices are configured using the different GaN layers of FIG. 4.

FIG. 5 shows how different GaN devices are configured using the different GaN layer of FIG. 4 in a next fabrication stage for integrated circuit 300. The next fabrication stage may use a hard mask over a left lateral section of integrated circuit 300. Etching process 158A may etch through the right lateral section of the epitaxial layers for LED (GaN device 150B) down to GaN cap layer 186. Mesas 193 may be etched down to undoped GaN layer 180, and buried contacts 195 may be formed in mesas 193.

A next processing operation may vertically etch a mesa 202 between the HEMT (GaN device 150A) and the LED (GaN device 150B) down into engineered substrate 110. A dielectric material may cover mesa 202 to provide an lateral electrical isolation between the HEMT (GaN device 150A) and the LED (GaN device 150B). A next processing operation may build a source electrode 164A and a drain electrode 164C on buried contacts 195, and build a gate electrode 164B on GaN cap layer 186.

Depending on the type of the HEMT device, the processing operation may etch another mesa and form another buried contact underneath gate electrode 164B down to AlGaN layer 184. An additional dielectric layer may be deposited between gate electrode 164E and GaN cap layer 186 to form a metal-insulator-semiconductor (MIS) HEMT device.

A next processing operation may etch a mesa 198 down to N-GaN layer 190 of the group of epitaxial layers for the LED (GaN device 150B) and form a buried n-contact 202 in mesa 198. Sidewalls of mesa 198 may be covered with an insulating material, such as, for example, silicon oxide. Processing operations may then be performed to form a n-electrode 164E (cathode) on buried n-contact 202 and form a p-electrode 164D (anode) on P-GaN layer 196.

The processing operation may then form a p-contact interconnect on top of P-GaN layer 196 for connecting, via a routing layer, to p-electrode 164D. P-electrode 164D and/or the p-contact interconnect may be transparent or highly reflective, depending on the final device architecture chosen for the LED device. A next processing operation may form interconnect 162A over drain electrode 164O and p-electrode 164D for connecting the drain of the HEMT (GaN device 150A) to the p-electrode 164D (anode) of the LED (GaN device 150B). In various embodiments, a processing operation also may be performed to form insulation layer 163 underneath interconnect 162A.

After the formation of interconnect 162A, integrated circuit 300 including the HEMT (GaN device 150A) and the LED (GaN device 150B) may be separated from engineered substrate 110, for example, at buffer layer 132, where the separated engineered substrate may be reused later for fabricating more devices, which would further reduce the cost of fabricating the devices. Separated integrated circuit 300 may have a roughened surface at or near undoped GaN layer 180 where engineered substrate 110 is separated. A layer of silicone material doped with phosphor may be applied to the roughened surface to encapsulate integrated circuit 300.

During operation of integrated circuit 300, a bias voltage may be applied across source electrode 164A of the HEMT (GaN device 150A) and n-electrode 164E of the LED (GaN device 150B). An activation voltage may be applied to gate electrode 164B of the HEMT to connect the bias voltage from source electrode 164A to p-electrode 164D of the LED and excite electrons in MQW layer 192 that emits light. The group of GaN epitaxial layers for the HEMT may be substantially transparent to the light emitted from MQW layer 192. The light may either exit directly into the silicone layer formed on inverted GaN layer 180 or be reflected by the highly reflective p-electrode and/or p-contact interconnect into the silicone layer. The light may excite the phosphor in the silicone layer, which may convert the light emitted from MQW layer 192 into a light that outputs from the LED (GaN device 150B) at a different wavelength.

In another example, an integrated circuit architecture may use a different monocrystalline layer 122, such as sapphire or SiC.

EXAMPLE METHODS

Figure 6:
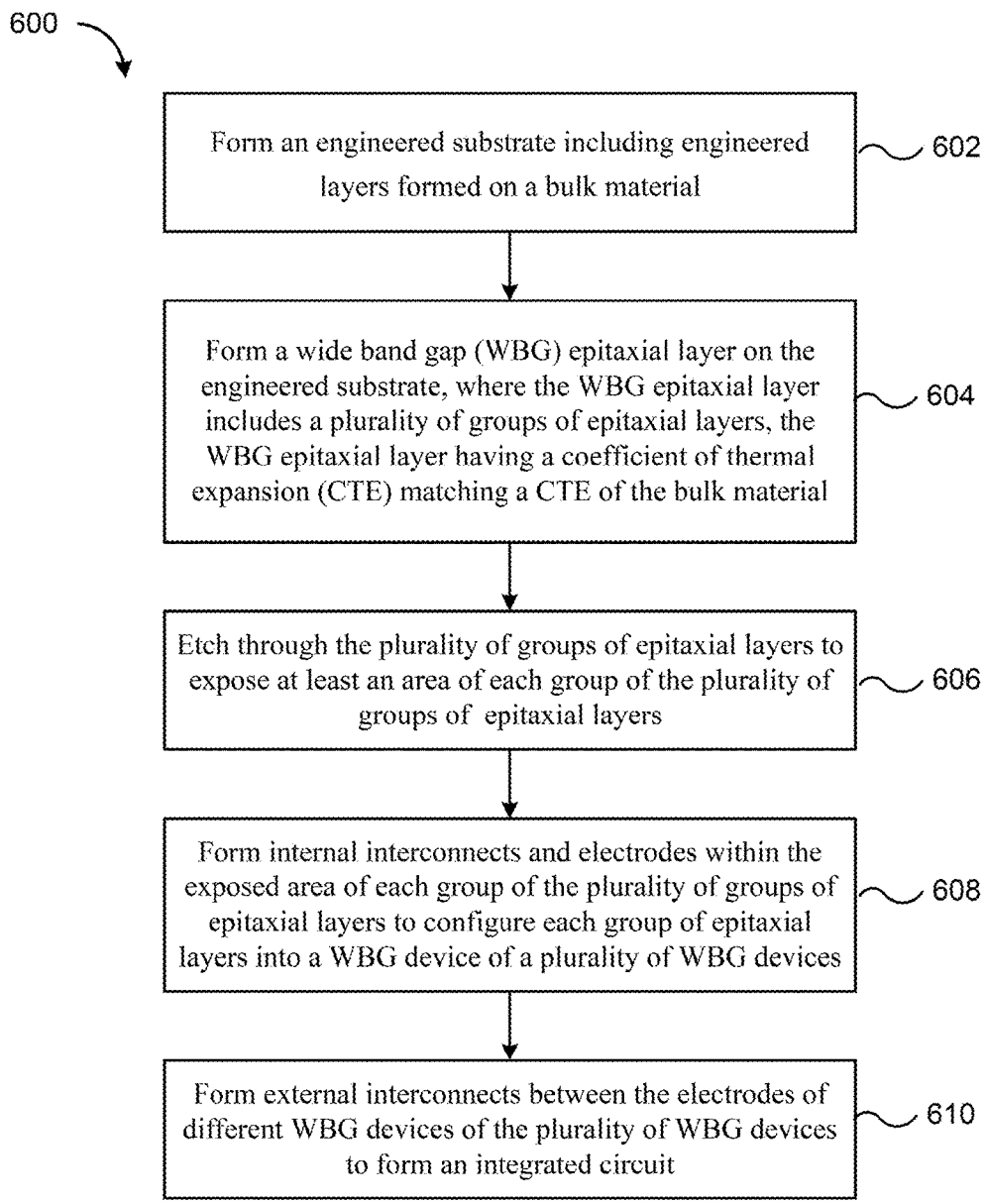
FIG. 6 shows a simplified flowchart illustrating a method of fabricating a WBG integrated circuit using an engineered substrate, according to an embodiment of the present invention.

FIG. 6 shows a simplified flowchart illustrating a method 600 of fabricating a WBG integrated circuit, such as a GaN integrated circuit, using an engineered substrate, according to an embodiment of the present invention. Method 600 may include, at 602, forming an engineered substrate on a bulk material. The bulk material may include a polycrystalline substrate, such as ceramic wafer 112 described above with respect to FIG. 1. The engineered substrate may include one or more outer engineered layers encapsulating the polycrystalline substrate, such as engineered layers 114 described above.

Method 600 may further include, at 604, forming a WBG epitaxial layer (e.g., a GaN epitaxial layer) on the engineered substrate. The bulk material may have a CTE matching a CTE of the WBG epitaxial layer, such that the CTEs of the bulk material and the WBG epitaxial layer may be within about 0.1%, 0.5%, 1%, 2%, 5%, or 10% of each other over a wide temperature range (e.g., from about 25° C. to about 1200° C.). The WBG epitaxial layer may include a plurality of groups of epitaxial layers, as described above with respect to FIG. 2.

Method 600 may also include, at 606, etching through the plurality of groups of epitaxial layers to expose at least an area of each group of the plurality of groups of epitaxial layers. The etching process may be an iterative N–1-step process, for example, for N groups of epitaxial layers (groups 1 to N). For example, during the first processing step, an area of epitaxial layers of groups 2-N may be etched to expose an area of the epitaxial layers of group 1. During the second processing step, an area of epitaxial layers of groups 3-N may be etched to expose an area of the epitaxial layers of group 2. The processing step may be repeated to expose an area of the epitaxial layers of each group of groups 3 to N–1.

Method 600 may further include, at 608, forming internal interconnects and electrodes within the exposed area of each group of the plurality of groups of epitaxial layers to configure each group of epitaxial layers into a WBG device of a plurality of WBG devices (e.g., GaN devices), as described above with respect to FIGS. 2 and 5.

Method 600 may further include, at 610, forming external interconnects between the electrodes of different WBG devices of the plurality of WBG devices to form an integrated circuit, as described above with respect to FIGS. 2 and 5.

It should be appreciated that the specific steps illustrated in FIG. 6 provide a particular method of processing an engineered substrate structure according to an embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual step. Furthermore, additional steps may be added and/or certain steps may be removed, depending on the particular applications. For example, method 600 may also include forming a buffer layer on the engineered substrate before forming the plurality of groups of epitaxial layers, and separating the formed integrated circuit from the engineered substrate. One of ordinary skill in the art would recognize many variations, modifications, and alternatives.

Figure 7:
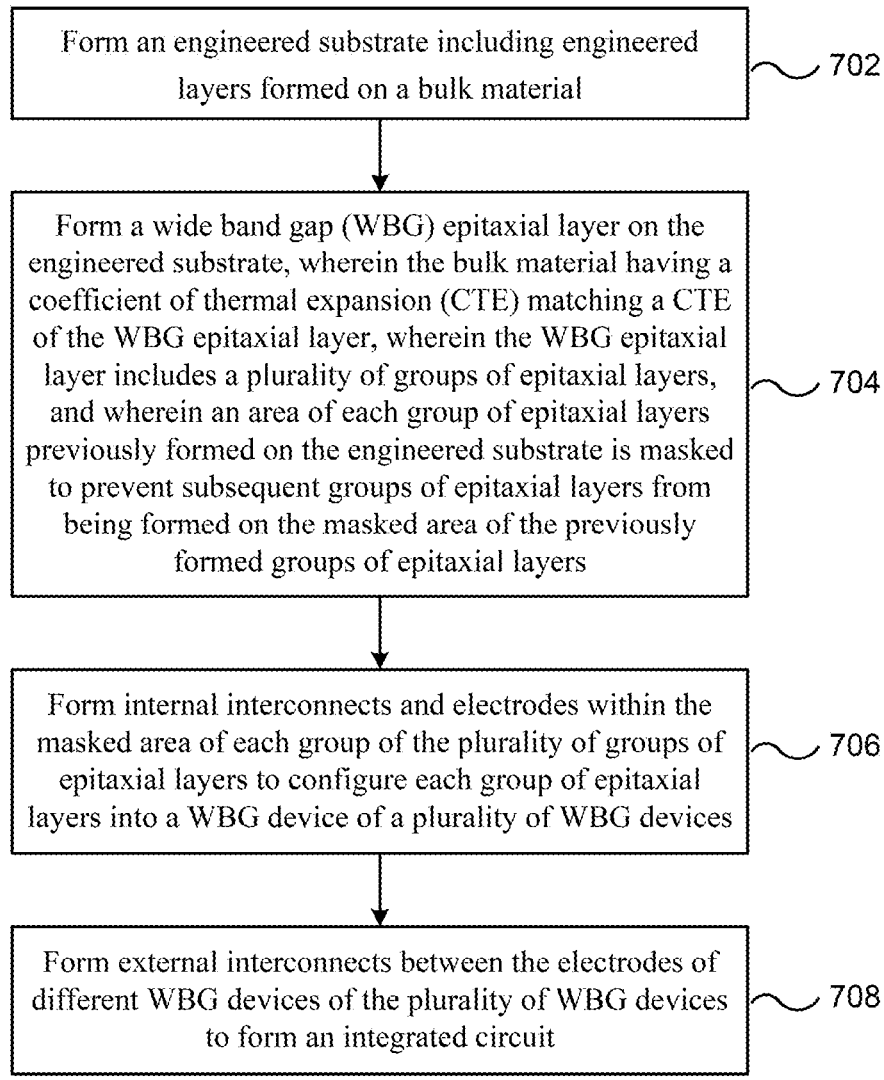
FIG. 7 shows a simplified flowchart illustrating a method of fabricating a WBG integrated circuit using an engineered substrate, according to another embodiment of the present invention.

FIG. 7 shows a simplified flowchart illustrating a method 700 of fabricating a WBG integrated circuit, such as a GaN integrated circuit, using an engineered substrate, according to another embodiment of the present invention. Method 700 may include, at 702, forming an engineered substrate on a bulk material. The bulk material may include a polycrystalline substrate, such as ceramic wafer 112 described above with respect to FIG. 1. The engineered substrate may include one or more outer engineered layers encapsulating the polycrystalline substrate, such as engineered layers 114 described above.

Method 700 may further include, at 704, forming a WBG epitaxial layer (e.g., a GaN epitaxial layer) on the engineered substrate. The bulk material may have a coefficient of thermal expansion (CTE) matching a CTE of the WBG epitaxial layer, such that the CTEs of the bulk material and the WBG epitaxial layer may be within about 0.1%, 0.5%, 1%, 2%, 5%, or 10% of each other over a wide temperature range (e.g., from about 25° C. to about 1200° C.). The WBG epitaxial layer may include a plurality of groups of epitaxial layers, as described above with respect to FIG. 2. During the formation of the plurality of groups of epitaxial layers, an area of each group of epitaxial layers previously formed on the engineered substrate may be masked to prevent subsequent groups of epitaxial layers from being formed on the masked area of the previously formed groups of epitaxial layers. In this way, at least an area of each group of epitaxial layers may be exposed for forming electrical connections.

Method 700 may also include, at 706, forming internal interconnects and electrodes within the masked area of each group of the plurality of groups of epitaxial layers to configure each group of epitaxial layers into a WBG device of a plurality of WBG devices (e.g., GaN devices), as described above with respect to FIGS. 2 and 5.

Method 700 may further include, at 708, forming external interconnects between the electrodes of different WBG devices of the plurality of WBG devices to form an integrated circuit, as described above with respect to FIGS. 2 and 5.

It should be appreciated that the specific steps illustrated in FIG. 7 provide a particular method of processing an engineered substrate structure according to an embodiment of the present invention. Other sequences of steps may also be performed according to alternative embodiments. For example, alternative embodiments of the present invention may perform the steps outlined above in a different order. Moreover, the individual steps illustrated in FIG. 7 may include multiple sub-steps that may be performed in various sequences as appropriate to the individual step. Furthermore, additional steps may be added and/or certain steps may be removed, depending on the particular applications. For example, method 700 may also include forming a buffer layer on the engineered substrate before forming the plurality of groups of WBG epitaxial layers, and separating the formed integrated circuit from the engineered substrate. One of ordinary skill in the art would recognize many variations, modifications, and alternatives. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A device comprising:
   a plurality of groups of gallium nitride (GaN) epitaxial layers, a combined thickness of the plurality of groups of GaN epitaxial layers greater than ten microns;
   mesas etched within at least some groups of the plurality of groups of GaN epitaxial layers;
   internal interconnects formed within the mesas;
   electrodes formed on at least one of the internal interconnects or the GaN epitaxial layers, the electrodes configuring each group of GaN epitaxial layers of the plurality of groups of GaN epitaxial layers into a GaN device of a plurality of GaN devices; and external interconnects formed over at least some of the electrodes for connecting the plurality of GaN devices into an integrated circuit.

2. The device of claim 1 wherein the plurality of groups of GaN epitaxial layers is formed on an engineered substrate with a diameter of at least 150 millimeters.

3. The device of claim 2 wherein a coefficient of thermal expansion (CTE) of the plurality of groups of GaN epitaxial layers matches a CTE of the engineered substrate.

4. The device of claim 1 wherein:
a first group of GaN epitaxial layers of the plurality of groups of GaN epitaxial layers forms a transistor;
a second group of GaN epitaxial layers of the plurality of groups of GaN epitaxial layers located on top of the first group of GaN epitaxial layers forms a light emitting diode (LED); and
the external interconnects connect an electrode formed on the transistor with an electrode formed on the LED.

5. The device of claim 4 wherein:
the second group of GaN epitaxial layers forms multiple quantum wells (MQWs) that emit light; and
the first group of GaN epitaxial layers is substantially transparent to the light emitted from the MQWs.

6. A gallium nitride (GaN) integrated circuit comprising:
a first set of GaN layers;
a first set of mesas, interconnects, and first electrodes for configuring the first set of GaN layers into a first GaN device;
a second set of GaN layers formed on top of the first set of GaN layers;
a second set of mesas, interconnects, and second electrodes for configuring the second set of GaN layers into a second GaN device; and
a third set of interconnects formed on at least an electrode of the first electrodes and at least an electrode of the second electrodes for connecting the first GaN device to the second GaN device.

7. The GaN integrated circuit of claim 6 wherein the first set of GaN layers and the second set of GaN layers have a combined thickness of at least 10 microns.

8. The GaN integrated circuit of claim 6 wherein the first set of GaN layers and the second set of GaN layers are formed on an engineered substrate with a diameter of at least six inches and have a coefficient of thermal expansion (CTE) substantially matching a CTE of the engineered substrate.

9. The GaN integrated circuit of claim 8 further comprising a buffer layer is disposed between the GaN integrated circuit and the engineered substrate.

10. The GaN integrated circuit of claim 8 wherein the engineered substrate may include one or more outer engineered layers encapsulating a polycrystalline layer.

11. The GaN integrated circuit of claim 10 wherein the polycrystalline layer comprises an aluminum nitride (AlN) substrate and the one or more outer engineered layers comprise at least one of oxide, nitride, or polysilicon.

12. The GaN integrated circuit of claim 6 further comprising an electrically isolating wide bandgap layer disposed between the first set of GaN layers and the second set of GaN layers.

* * * * *

UNITED STATES PATENT AND TRADEMARK OFFICE
CERTIFICATE OF CORRECTION

PATENT NO. : 10,141,371 B2  
APPLICATION NO. : 15/367108  
DATED : November 27, 2018  
INVENTOR(S) : Vladimir Odnoblyudov et al.

Page 1 of 1

It is certified that error appears in the above-identified patent and that said Letters Patent is hereby corrected as shown below:

On the Title Page

Insert the following amended title in item (54):
--WIDE BAND GAP INTEGRATED CIRCUIT DEVICE--

Signed and Sealed this
Twenty-second Day of January, 2019

Andrei Iancu
*Director of the United States Patent and Trademark Office*